United States Patent [19]

Knauer

[11] 4,230,952
[45] Oct. 28, 1980

[54] REGENERATOR CIRCUIT FOR CCD ARRANGEMENTS IN A MULTI-LAYER METALLIZATION STRUCTURE

[75] Inventor: Karl Knauer, Gauting, Fed. Rep. of Germany

[73] Assignee: Siemens Aktiengesellschaft, Berlin & Munich, Fed. Rep. of Germany

[21] Appl. No.: 912,094

[22] Filed: Jun. 2, 1978

Related U.S. Application Data

[63] Continuation of Ser. No. 725,551, Sep. 22, 1976, abandoned.

[30] Foreign Application Priority Data

Sep. 25, 1975 [DE] Fed. Rep. of Germany ....... 2542832

[51] Int. Cl.² ..................... G11C 19/28; H01L 29/78
[52] U.S. Cl. ................... 307/221 D; 357/24
[58] Field of Search ................. 357/24; 307/221 D

[56] References Cited

U.S. PATENT DOCUMENTS

| | | | |
|---|---|---|---|
| 3,654,499 | 4/1972 | Smith | 357/24 |
| 3,737,683 | 6/1973 | Sangster | 357/24 |
| 3,819,954 | 6/1974 | Butler et al. | 357/24 |
| 3,876,952 | 4/1975 | Weimer | 357/24 |
| 3,902,186 | 8/1975 | Engeler | 357/24 |
| 3,914,748 | 10/1975 | Barton et al. | 357/24 |
| 3,946,248 | 3/1976 | Buss | 357/24 |
| 3,965,462 | 6/1976 | Belt | 357/24 |
| 3,969,634 | 7/1976 | Su et al. | 357/24 |
| 3,989,956 | 11/1976 | Walden | 357/24 |
| 4,013,897 | 3/1977 | Kamigaki et al. | 357/24 |

OTHER PUBLICATIONS

Lancaster et al. "A Recirculating CCD with Novel Input and Output Structures", IEEE Int. Electron Devices Meeting, (12/74), Tech. Dig., pp. 108-111.

*Primary Examiner*—Gene M. Munson
*Attorney, Agent, or Firm*—Hill, Van Santen, Steadman, Chiara & Simpson

[57] ABSTRACT

A regenerator circuit for charge coupled devices removes charges produced by leakage currents along the shift channel of the charge coupled device. The regenerator circuit may also remove echo signals which develop in the shift channel. For removing charge produced leakage currents at given intervals along a shift channel of a substrate, an electrode is provided adjacent an electrode of a shift element and at a side of the shift channel. A diffusion zone doped oppositely to the substrate is arranged at the side of this shift element electrode. An electrode which follows the electrode of the shift element in the direction of charge shift has a separate terminal. For removing echo signals developed in the shift channel, a further electrode is arranged between electrodes of oppositely facing shift elements in a CCD loop. A shift element electrode which follows one of the shift element electrodes on either side of the further electrode has a separate terminal.

3 Claims, 6 Drawing Figures

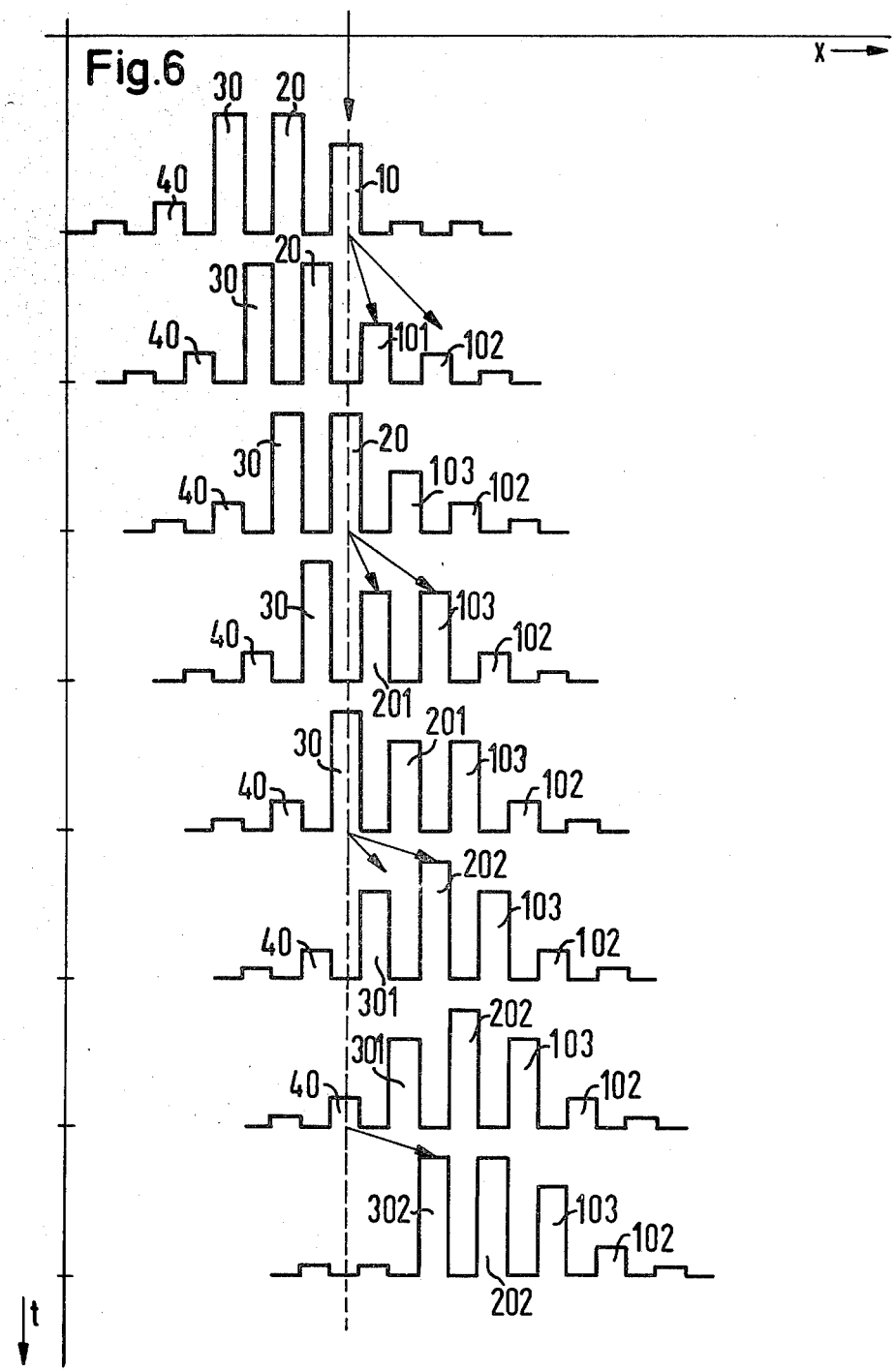

REGENERATOR CIRCUIT FOR CCD ARRANGEMENTS IN A MULTI-LAYER METALLIZATION STRUCTURE

This is a continuation of application Ser. No. 725,551, filed Sept. 22, 1976, now abandoned.

BACKGROUND OF THE INVENTION

1. Field of the Invention

The invention relates to a regenerator circuit for CCD arrangements in a multi-layer metallization structure.

2. Description of the Prior Art

In charge coupled circuits it is necessary to regenerate the information after a specific number of transmissions in order to retain the original information. High demands are made on the regenerator stages needed for this purpose in terms of space requirements and transmission speed.

For example, in known digital regenerator stages, on the basis of the quantity of charge incoming in the regenerator stages, a decision is made as to whether a new charge parcel is to be input at the following input or not. This is generally effected in that the incoming charge parcel serves to influence the potential at the gate terminal of a MOS field effect transistor of the input stage in such manner that either current flows or does not flow between the source zone and the drain zone of the transistor.

In addition to the relatively large space requirements, such circuits have a further disadvantage that they do not comply with the speed requirements of approximately 10 MHz for CCD arrangements.

SUMMARY OF THE INVENTION

It is an object of the present invention to provide a regenerator circuit for CCD arrangements having small space requirements and which meets the imposed speed requirements.

This object is realized by a regenerator circuit which has a first regenerator electrode arranged at a given interval at the side of a shift channel of the CCD next to a first electrode of the shift element. A diffusion zone doped oppositely to the substrate and arranged at the side of the first regenerator electrode on a surface of the substrate is provided. This diffusion zone laterally extends to the first electrode. A separate terminal is then provided on a second electrode of the shift elements which follows the first electrode of the shift elements in the direction of charge shift. Such structure allows the charge produced by leakage currents along the shift channel to be removed. A second regenerator electrode may be arranged at a side of a third electrode of the shift elements at a given interval along the shift channel. This second regenerator electrode laterally adjoins the third electrode of the shift elements and also a fourth electrode of the shift elements which lies across from the third electrode such that the second regenerator electrode is between the third and fourth electrodes. A separate terminal is provided on the fifth electrode of the shift elements which follows the third electrode in the direction of charge shift. This structure permits the removal of echo signals produced in the CCD. It is an advantage of the invention that signal falsification or deterioration caused by traps and short transmission times are compensated.

DESCRIPTION OF THE DRAWINGS

FIG. 6 shows a locus diagram of signal regeneration.

DESCRIPTION OF THE PREFERRED EMBODIMENTS

The following considerations are important to the invention. In the storage of digital information in CCD elements, two fault sources must be taken into particular consideration. On the one hand, in the course of time all the potential sinks are filled by leakage currents, so that the available amplitude range disappears. On the other hand, during the charge transport a component of every charge parcel remains in the traps due to transmission times which are too short. As a result, the signal charge is reduced and a so-called echo is formed. Here echo is to be understood as a signal which follows the actual charge parcel displaced in time with a smaller amplitude.

The invention provides a device for regeneration with which the above described fault sources are largely compensated.

The quantity of charge which arises in all potential sinks as a result of leakage currents in basic charge operation is in first approximation independent of whether a charge parcel is already present in the sink—which corresponds to a logic "1"—or whether no charge parcel is present in the sink—which corresponds to a logic "O". The leakage current can thus be compensated since after a specific length of time, and thus after a specific number of transmissions, an equal quantity of charge is taken from all the potential sinks. This is represented with reference to FIGS. 1 to 3 in the example of a two-phase CCD.

Figure 1:
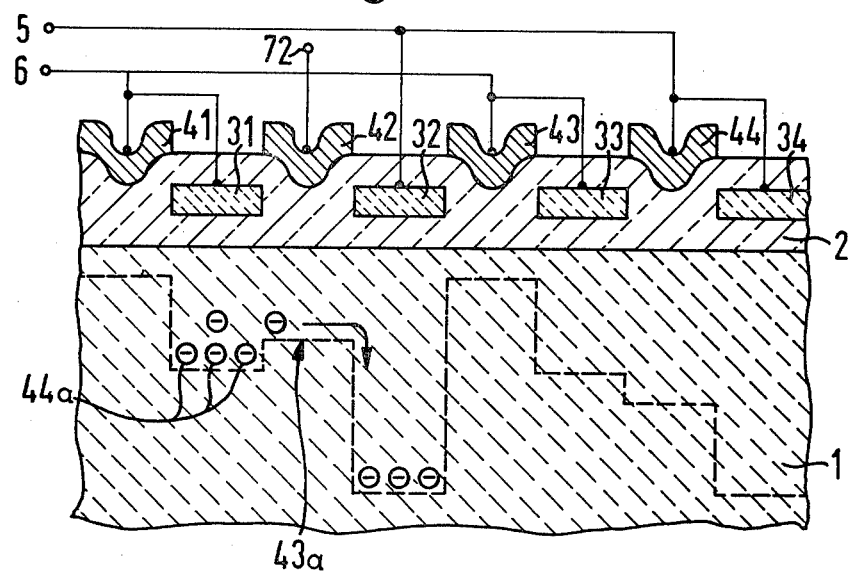
FIG. 1 schematically illustrates a sectionl view of a CCD arrangement with a regenerator circuit in accordance with the invention for removing the charge produced by leakage currents in potential sinks.
Figure 2:
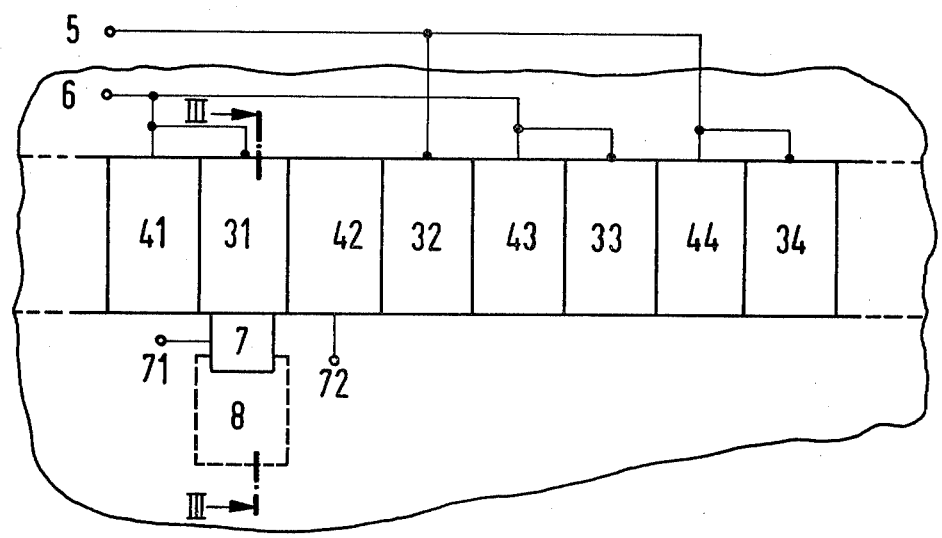
FIG. 2 is a plan view of the circuit corresponding to FIG. 1.
Figure 3:
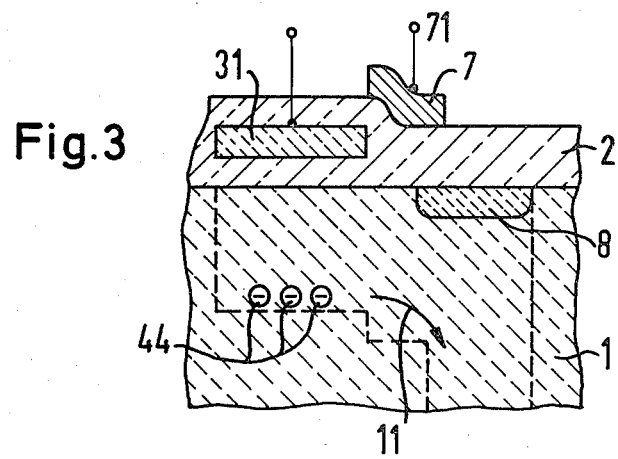
FIG. 3 shows the section III—III of FIG. 2 through the regenerator circuit.

FIG. 1 is a sectional view and FIG. 2 a plan view of a regenerator circuit in accordance with the invention for the removal of charges produced by leakage currents in association with a two-phase CCD. Here, an electrically insulating layer 2 is applied to the substrate 1 which preferably consists of semiconducting silicon material. In the electrically insulating layer 2, which preferably consists of $SiO_2$, electrodes 31 to 34, which preferably consist of silicon, are arranged in the first plane. These electrodes 31 to 34 are separated from one another by gaps. On the electrically insulating layer 2, the electrodes of the second plane 41 to 44, which preferably consist of aluminium, are arranged above the gap between the electrodes 31 to 34 of the first plane. For example, at the position of the electrode 31 (FIG. 2), a specific quantity of charge is to be taken from the potential sink. For this purpose, as can be seen in particular from FIGS. 2 and 3, an electrode 7 provided with a terminal 71 is arranged laterally next to the shift channel beside the electrode 31 of the CCD arrangement in the second plane. In the manner shown in FIGS. 2 and 3, a diffusion zone 8 oppositely doped to the substrate 1 is arranged on the surface of the semiconducting substrate 1 beside and overlapping with the electrode 7. FIG. 3 shows the section III—III indicated in FIG. 2, through the electrode 31 of the first plane, the electrode 7 of the second plane, and the diffusion zone 8.

For example, these stages corresponding to the invention are arranged in regular intervals next to CCD elements, such as approximately ever 100 CCD elements.

In the following the function of the suction of charge from the potential sink according to the invention will be described. For example, the terminal 72 of the left electrode 42 of the pair of electrodes 42/32, which during the transmission acts as a threshold 43a (FIG. 1), is connected to a voltage of a value such that the entire charge parcel is not transmitted from the preceding pair of electrodes (41/31), but rather, a desired component 44 which corresponds to the charge produced by leakage currents remains behind. For this purpose, to the terminal 72 the same pulse train is connected as is connected to the corresponding other terminals of the same pulse train. The amplitude of this pulse train is, however, selected to be lower so that a threshold remains in the transmission direction. This remaining charge component 44a can now be laterally displaced by the opening induced by the electrode 7 (FIG. 3, arrow 11) and removed via the diffusion zone 8. For this purpose the terminal 71 of the electrode 7 and the diffusion zone 8 are each connected to a potential which is such that the potential drop represented in FIG. 3 occurs towards the diffusion zone 8.

With the stage of this invention it is not only possible to produce the charge produced by leakage currents, but also a uniform basic charge. With a modified pulse diagram it is also possible to read-out the information stored in the CCD via such a stage.

Figure 4:
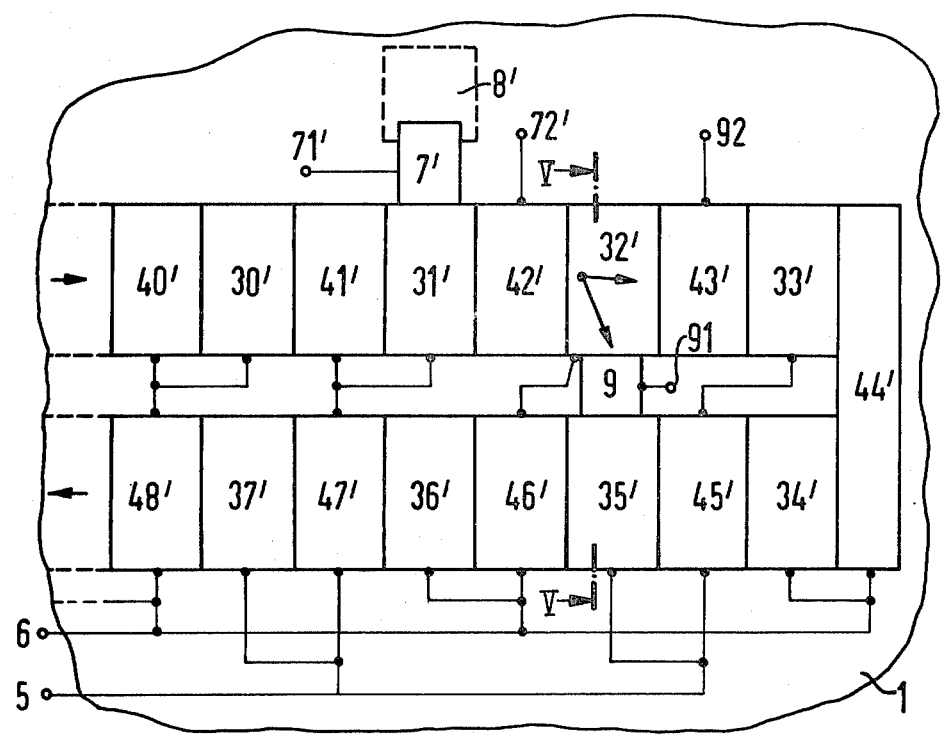
FIG. 4 is a plan view of a regenerator circuit in accordance with the invention for signal regeneration and for removing the charge produced by leakage currents in potential sinks.

To correct the signal falsification which has arisen as a result of the transmission losses, a second stage is necessary which operates in accordance with the same principle as that described above. Again a fixed, equal-sized charge quantity 44a' is held back from each charge parcel. This quantity of charge is not removed, however, but placed one unit in advance of the charge parcel from which it has been taken. FIG. 4 shows the construction of such a device in accordance with the invention for signal regeneration at the end of a CCD loop. Details of FIG. 4 which have already been described in association with the other Figures bear the corresponding references. FIG. 4 also contains the regenerator stage of the invention (31', 7', 8') corresponding to FIG. 2. If the retained quantity of charge 44a' is selected to be such that it corresponds to that quantity of charge which has been left behind from a charge parcel during the transmission and which forms a follower or echo, then the advancing permits the follower or echo to be again added to the signal pulse.

Figure 5:
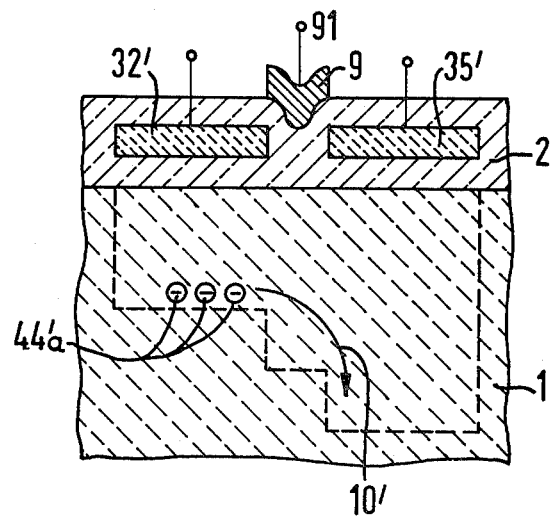
FIG. 5 illustrates the section V—V of FIG. 4.

FIG. 4 illustrates a CCD loop. Here the electrodes (40', 30'), (41', 31') through (47', 37') form pairs of electrodes of a two-phase CCD arrangement. These pairs of electrodes are operated in known manner via the pulse train lines 5 and 6. The charge output-coupling and charge transmission is to occur at the point of the section V— V. FIG. 5 illustrates this section V—V. An electrode 9 with a terminal 91 is represented at the side of the shift channel next to the electrode 32' in the second plane. This electrode 9 is also next to the electrode 35' of the opposite shift channel.

In the following the function will be described in association with FIGS. 5 and 6. Fig. 6 represents three consecutive pulses 10, 20 and 30. Here the pulse 10 is located precisely at the location 32' of the regenerator stage in accordance with the invention. It will be assumed that the incoming signal is falsified, which means that the first charge parcel 10 to arrive at the location of the regenerator circuit contains less charge. It will be further assumed that an echo 40 occurs behind the third and last charge parcel 30. The information is now influenced in such manner that in the regenerator stage, which consists of the electrodes 32', 9 and 35', in each signal a first quantity of charge 44a' is advanced by one unit, provided that sufficient charge is present. In other words, as shown in FIG. 6, a quantity of charge 44a is first advanced from the charge parcel 10 so that from the charge parcel 10 the charge parcel 101 is formed which is in front of the charge parcel 102. For this purpose, as can be seen from FIG. 5, the electrodes 32', 91 and 35' are connected to potentials so that the potential stage represented in FIG. 5 is formed. The terminal 92 of the electrode 43' is connected to the same pulse train as the other corresponding terminals. The amplitude of this pulse train is lower, however, so that a threshold remains in the transmission direction. In this way the charge 44a' of the charge parcel 10 is sucked beneath the electrode 35' so that at that point the charge parcel 102 corresponding to the quantity of charge 44a' is formed. As a result of the deduction of the quantity of charge 44a', the charge parcel 10 beneath the electrode 32' has now become the charge parcel 101. When the second charge parcel 20 is located beneath the regenerator stage, the quantity of charge 44a' is again taken from the latter. This quantity of charge is then added to the charge parcel 101 located beneath the opposite electrode 35' so that the charge parcel 103 assumes the magnitude of the original charge parcel 10. The charge parcel 20 has then been reduced by the quantity of the charge 44a'. This charge parcel is referenced 201. With the next pulse train, the third charge parcel 30 lies beneath the electrode 32' of the regenerator circuit in accordance with the invention. The charge quantity 44a' is again taken from this charge parcel 30 and is added to the charge parcel 201 then located beneath the electrode 35'. In this way the charge parcel 201 is enlarged by the quantity of charge 44a'. This enlarged charge parcel is referenced 202. By deducting the quantity of charge 44a' from the charge parcel 30, the charge parcel 301 is formed. After the third charge parcel 30, the echo 40 passes beneath the electrode 32' of the regenerator circuit in accordance with the invention. The quantity of charge of the echo 40 corresponds to the charge 44a'. This charge 44a' is now transmitted to the opposite electrode 35', so that the charge parcel 301 located at that point becomes the charge parcel 302 which is then equal in size to the charge parcel 202. In this way the echo 40 has been displaced.

The component 102 of the first charge parcel 10 which has been moved forward (forerunner) is advantageously held back in traps in the following transmissions and thus again becomes a signal pulse.

The signal which consists of the pulses 102, 103, 202 and 302 leaves the regenerator stage in accordance with the invention. As a result of the loss mechanisms occurring in the CCD, after n transmissions, the signal achieves more or less the form which it possessed at the start.

As the circuits of the invention likewise operate in accordance with the CCD principle, they are characterized by small space requirements and high speeds.

Advantageously the regenerator circuits in accordance with the invention are employed when for several CCD stores high-speed hunting sequences are necessary in order to bring a desired item of information to a given position.

The regenerator circuit in accordance with the invention is suitable for two-phase and four-phase operation when a modification threshold is to be present between the emitting and the receiving potential sink.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A regenerator system in a charge coupled device loop for removing leakage current produced charges and echo signals produced by incomplete transfer of signal charge between storages areas, comprising:
    (a) first and second spaced apart charge shift channels with a connecting electrode connecting the channels to each other at one end;
    (b) each channel having a substrate and charge shift electrodes forming shift elements above the substrate;
    (c) first and second clock pulse lines connecting to the shift electrodes;
    (d) a first regenerator electrode arranged at a side of the first shift channel next to a first electrode of the first shift channel;
    (e) a diffusion zone of first conductivity type opposite a second conductivity type of the substrate at a side of the first regenerator electrode on a surface of the substrate, said diffusion zone laterally extending to the first regenerator electrode;
    (f) a second electrode of the first shift channel sequentially adjacent the first electrode in a direction of charge shift not being connected to either of said first and second clock pulse lines;
    (g) a second regenerator electrode lying between a third electrode of the first shift channel and a first electrode of the second shift channel;
    (h) a fourth electrode of the first shift channel sequentially adjacent the third electrode in the direction of charge shift, said fourth electrode not being connected to either of said first and second clock pulse lines;
    (i) first potential means periodically connected to the second regenerator electrode for transferring a portion of charge of magnitude corresponding to the echo to the second shift channel first electrode; and
    (j) second potential means periodically connected to the fourth electrode for retaining said portion of charge beneath the third electrode.

2. A method for removing leakage current produced charges and echo signals produced by incomplete transfer of charge between storage areas in a charge coupled device loop for conveying a signal charge and being formed of first and second shift channels with a connecting electrode connecting the channels to each other at one end, comprising the steps of:
    (a) removing leakage current produced charges created by charge carrier leakage into storage zones of the first shift channel by:
        (i) providing a first regenerator electrode and an adjacent diffusion zone in a substrate of the first shift channel alongside a first electrode of the first shift channel, a first conductivity type of the diffusion zone being opposite a second conductivity type of the substrate;
        (ii) creating a potential barrier for leakage current produced charge but not the signal charge by connecting a potential to a second electrode sequentially adjacent the first electrode in a direction of charge shift;
        (iii) connecting a potential to the first regenerator electrode to shift the leakage current produced charge into the diffusion zone;
    (b) removing an echo signal produced by incomplete transfer of signal charge between storage areas of the first shift channel by:
        (i) providing a second regenerator electrode between a third electrode of the first shift channel and a first electrode of the second shift channel;
        (ii) creating a potential barrier for a quantity of charge corresponding to the echo signal but allowing remaining signal charge to pass by connecting a potential to a fourth electrode sequentially adjacent the third electrode in the direction of charge shift; and
        (iii) connecting a potential to the second regenerator electrode to shift the quantity of charge corresponding to the echo signal from the first shift channel third electrode to the second shift channel first electrode.

3. A method for removing echo signals in a charge coupled device loop for conveying a signal charge and being formed of first and second shift channels with a connecting electrode connecting the channels to each other at one end, comprising the steps of:
    (a) providing a first regenerator electrode between a first electrode of the first shift channel and a first electrode of the second shift channel;
    (b) creating a potential barrier for a quantity of charge corresponding to the echo signal but allowing remaining signal charge to pass by connecting a potential to a second electrode sequentially adjacent the first shift channel first electrode in the direction of charge shift; and
    (c) connecting a potential to the first regenerator electrode to shift the quantity of charge corresponding to the echo signal from the first shift channel first electrode to the second shift channel first electrode.

* * * * *